United States Patent

Zimmermann et al.

[11] Patent Number: 5,458,911
[45] Date of Patent: Oct. 17, 1995

[54] METHOD OF PRODUCING A SELF-SUPORTING THICK-FILM STRUCTURE

[75] Inventors: Herbert Zimmermann, Freiberg/Heutingsheim; Guenther Stecher, Leonberg, both of Germany

[73] Assignee: Robert Bosch GmbH, Stuttgart, Germany

[21] Appl. No.: 170,260

[22] PCT Filed: Jun. 17, 1992

[86] PCT No.: PCT/DE92/00498

§ 371 Date: Dec. 28, 1993

§ 102(e) Date: Dec. 28, 1993

[87] PCT Pub. No.: WO93/00713

PCT Pub. Date: Jan. 7, 1993

[30] Foreign Application Priority Data

Jun. 28, 1991 [DE] Germany .................. 41 21 390.4

[51] Int. Cl.⁶ .................................................. B05D 5/12
[52] U.S. Cl. .................. 427/126.2; 427/331; 427/376.1; 427/376.2
[58] Field of Search ............................. 427/126.2, 376.2, 427/331, 376.1

[56] References Cited

U.S. PATENT DOCUMENTS

| | | | |
|---|---|---|---|
| 4,382,247 | 5/1983 | Stecher et al. | 338/42 |
| 4,816,200 | 3/1989 | Stecher et al. | 264/59 |
| 5,097,386 | 3/1992 | Byell et al. | 361/384 |

FOREIGN PATENT DOCUMENTS

| | | | |
|---|---|---|---|
| 2445086 | 5/1975 | Germany | H01G 4/12 |
| 2829195A1 | 2/1979 | Germany | G11B 5/20 |
| 3008572A1 | 9/1981 | Germany | G01L 7/08 |
| 3015356A1 | 10/1981 | Germany | H01L 47/02 |

*Primary Examiner*—Benjamin Utech
*Attorney, Agent, or Firm*—Spencer, Frank & Schneider

[57] ABSTRACT

A method for producing a self-supporting thick-film structure on a substrate above a recess defined in the substrate, includes applying an active layer onto an auxiliary substrate; positioning the active layer in contact with the substrate and above the recess defined in the substrate; firing the substrate to bond the active layer thereto; and separating the active layer bonded to the substrate from the auxiliary substrate, wherein the active layer has a thermal expansion coefficient which is less than that of the substrate so that a self-supporting thick-film structure is formed above the recess.

20 Claims, 1 Drawing Sheet

METHOD OF PRODUCING A SELF-SUPORTING THICK-FILM STRUCTURE

BACKGROUND OF THE INVENTION

1. Field of the Invention

The invention relates to a method for producing a self-supporting thick-film structure on a substrate over a recess in this substrate.

2. Description of the Related Art

Thick-film circuits are preferably produced on ceramic, plate-like substrates by means of printing on a paste whose active material comprises metal powders, glass and glass-ceramic powders or mixtures of glass and metal oxides. Subsequent to firing these printed-on pastes at temperatures around approximately 850° C., metallic layers, glass and glass-ceramic layers or resistance layers are produced, depending on the pastes used in each case. The entire surface of these layers bonds during firing with the surface of the substrate on which they subsequently form a firmly adhering substance.

These types of thick-film circuits find application in many fields of technology.

Some cases require that the layer including the active substance does not contact the entire substrate surface, but that bulging creates cavities in which, for example, conductor paths, elevations or other circuit components are arranged. Attention is directed, for example, to DE-OS (German Unexamined Published Patent Application) DE-OS 3,015,356, DE-OS 3,008,572 and DE-OS 2,829,195. However, these closed bubbles have the disadvantage that the air cushion in the bubble has certain undesirable effects on the circuit and the circuit components. Thus, a heat flow which still occurs through the air cushion worsens, for example, the dynamic characteristics of a sensor inside the closed bubble. This is why it might be desirable in some cases that, although a cavity is formed, this cavity not be closed on all sides. In that case, a recess, through which the cavity remains open, would need to be present in the substrate, with the cavity itself, however, being covered by the thick-film structure.

SUMMARY OF THE INVENTION

According to the method of the present invention, a bulge or a self-supporting dome is produced above the recess such that no closed bubble is formed below it. To this end, the layer has a thermal expansion coefficient which is less than that of the substrate. This means that during firing of the latter with the layer placed on it, the substrate expands further in the recess than the active layer and thus the latter forms a bulge over the recess.

Moreover, a dielectric material which can be fired is used for the layer, while the substrate may be made of ceramics, insulated high temperature steel or glass.

What is essential above all is the method step for producing the active layer and its preparation, respectively. It is understandable that this layer cannot be directly applied to the actual substrate, because otherwise it would fall into this recess. According to the invention, an auxiliary substrate is therefore used, and the actual substrate is not connected to the layer until after the layer is produced on this auxiliary substrate. It is preferable to initially print a glass-ceramic layer onto the auxiliary substrate on a glass-ceramic layer, with a hole, whose purpose will be explained below, remaining open in this layer. In any case, the diameter of the hole should correspond to approximately one half the diameter of the thick-film structure which is later to be of a self-supporting configuration. This layer is then fired at approximately 850° C. in air.

Now a filler substance, which may, for example, be carbon, is printed onto the fired layer. The function of this filler substance is primarily to facilitate the subsequent detachment of the active layer as soon as the latter contacts the actual substrate. This is why the outer diameter of the filler substance layer and its outer contours, respectively, are greater than those of the active layer. This filler substance layer is then sintered down also at approximately 850° C. in a nitrogen atmosphere.

Now the actual dielectric layer, which can be fired in a nitrogen atmosphere, is printed on, with the firing of this layer, which also takes place in nitrogen, producing a protuberance in the region of the above-mentioned hole. The filler substance layer as well as the active layer sink down into the region of the hole. This protuberance ensures later, while being fired together with the actual substrate, an unequivocal bulging of the active layer away from the recess.

Prior to bonding the actual substrate with the active layer, a glass-containing paste is printed onto the substrate. The purpose of this glass-containing paste is to ensure a better bond with the active layer. Now the actual substrate together with the paste is placed onto the auxiliary substrate with the active layer, with the recess lying approximately centered in relation to the concave protuberance. In this phase of the method, the paste may be wet, dried or fired. Then the entire structure is fired. Because of the bulge, the active layer already detaches itself from the layer of the filler substance during firing. In this manner the actual substrate with the active layer is separated from the auxiliary substrate. The auxiliary substrate may then be used again to produce additional self-supporting thick-film structures; the substrate with the active layer is processed further.

BRIEF DESCRIPTION OF THE DRAWINGS

An embodiment of the invention is shown in the drawing and is explained in greater detail in the following description. In the drawing.

DESCRIPTION OF THE PREFERRED EMBODIMENTS

Figure 1:
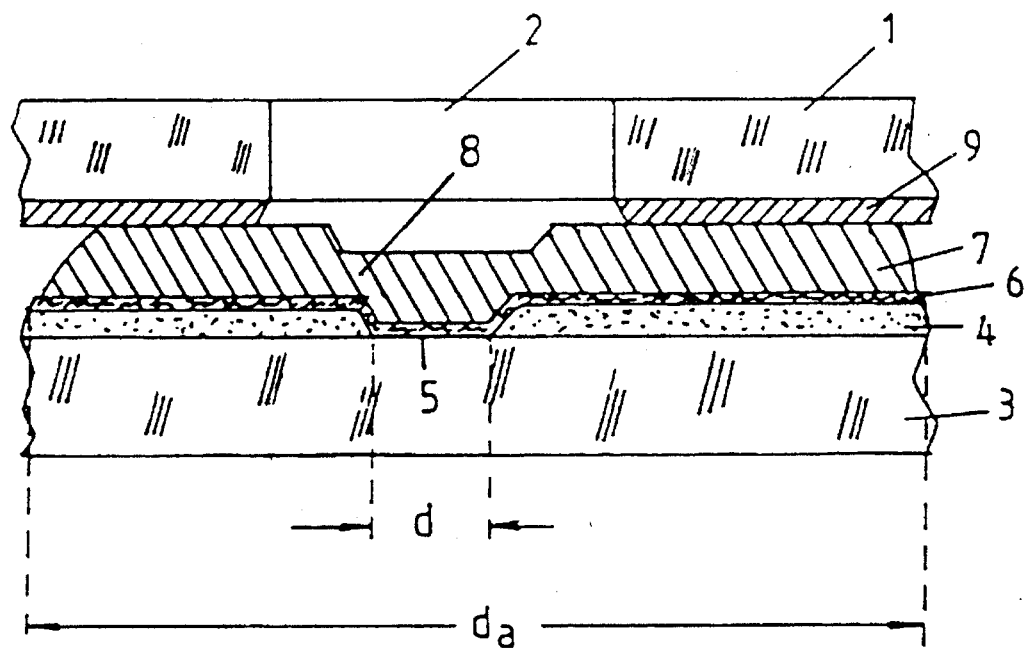
FIG. 1 is a cross-sectional view of a thick-film structure during the production method according to the invention.

The present invention relates to the realization of self-supporting thick-film structures on a substrate 1, which is provided in the region of the self-supporting structure with a hole-shaped recess 2 of any desired contour. The substrate 1 itself may consist, for example, of ceramic, an insulated high temperature steel or of glass.

To produce this self-supporting thick-film structure, an auxiliary substrate 3 is used and is imprinted with a glass-ceramic layer(intermediate layer) 4. However, the imprinting using the glass ceramic layer 4 is done in such a way that a hole 5 having a diameter d remains open. This diameter corresponds to approximately one half of the diameter of the thick-film structure which is later configured to be self-supporting.

As the next method step, the glass-ceramic layer 4 is now fired at approximately 850° C. in air, as is customary in thick-film technology.

Then, a suitable filler substance 6, for example, carbon, is printed onto the glass-ceramic layer 4. The outer diameter $d_a$ of this filler layer 6 of filler substance is in any case greater than that of active layer 7 for the self-supporting structure. Prior to application of layer 7, the carbon layer, as the filler substance layer, is also sintered down at 850° C. in a nitrogen atmosphere.

Now layer 7 for the self-supporting thick layer structure is applied. This layer 7 comprises a dielectric substance which can be fired in a nitrogen atmosphere, and is printed onto filler substance 6. The outer contours of this layer must not exceed those of filler substance 6. Subsequent to firing in nitrogen, a concave protuberance 8 results in layer 7.

Separately from this construction of layers, substrate 1, which is provided with the hole-shaped recess 2, is imprinted, for example, in the form of a ring, with a paste layer 9 containing glass. The substrate 1 together with paste 9, which may still be wet, already dried or fired, may be placed on the auxiliary substrate 3 and its layers in such a way that the hole-shaped recess 2 is caused to be positioned approximately central to the concave protuberance 8.

Figure 2:
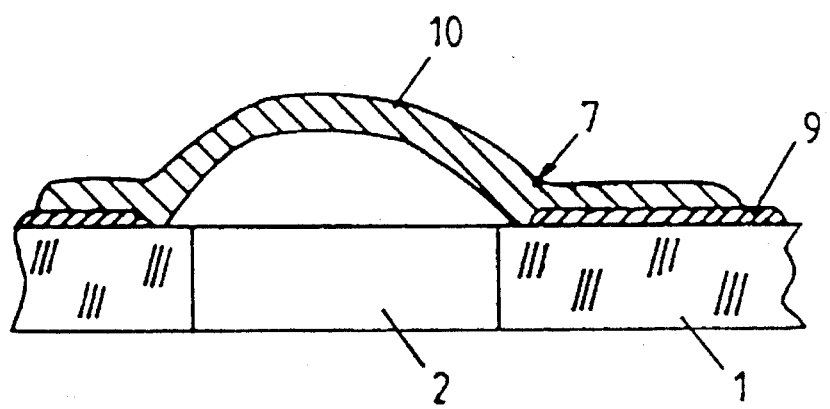
FIG. 2 is a partial cross-sectional view of a thick-film structure subsequent to the completion of the production method according to the invention.

During the subsequent firing at approximately 850° C. in air, layer 7 bonds with the glass-containing paste 9 and thus with substrate 1 and forms a self-supporting dome 10 above recess 2, as indicated in FIG. 2. This self-supporting dome 10 whose bulge is the result of the thermal expansion coefficient of layer 7 being less than that of substrate 1. Due to protuberance 8, an unequivocal bulge away from the hole-shaped recess 2 is created after firing.

Substrate 1 with the self-supporting dome 10 and layer 7 may now be processed further. Auxiliary substrate 3 with layer 4, however, may be used again, for example, for manufacturing a further self-supporting thick-film structure.

What is claimed is:

1. A method for producing a thick-film structure having a self-supporting region on a primary substrate above a recess defined in the primary substrate, the method comprising:

applying an active layer onto an auxiliary substrate;

positioning the active layer in contact with the primary substrate and above the recess defined in the primary substrate;

firing the primary substrate to bond the active layer thereto; and separating the active layer bonded to the primary substrate from the auxiliary substrate, wherein the active layer has a thermal expansion coefficient which is less than that of the primary substrate so that a thick-film structure having a self-supporting region above the recess is formed on the primary substrate.

2. The method according to claim 1, wherein the active layer is comprised of a dielectric material which can be fired, and wherein the substrate primary comprises a substance selected from the group consisting of a ceramic, an insulated high temperature steel, and a glass.

3. The method according to claim 1, further comprising firing to produce a concave protuberance in the active layer.

4. The method according to claim 1, further comprising printing an intermediate layer onto the auxiliary substrate prior to applying the active layer onto the auxiliary substrate, the intermediate layer having defined therein a hole which remains open in the self-supporting region of the thick-film structure.

5. The method according to claim 4, wherein the intermediate layer is comprised of a glass-ceramic.

6. The method according to claim 4, wherein the self-supporting region of the thick-film structure is circular and has a diameter, wherein the hole defined in the intermediate layer is circular and has a diameter, and wherein the diameter of the hole defined in the intermediate layer is approximately half the diameter of the self-supporting region of the thick-film structure.

7. The method according to claim 4, further comprising firing the intermediate layer in air at a temperature of approximately 850° C. prior to applying the active layer onto the auxiliary substrate.

8. The method according to claim 7, wherein the active layer and the filler layer have respective outer contours, and wherein the outer contour of the filler layer is greater than the outer contour of the active layer.

9. The method according to claim 4, further comprising printing a filler layer comprised of a filler substance onto the intermediate layer, prior to applying the active layer onto the auxiliary substrate.

10. The method according to claim 1, further comprising printing a paste layer containing glass onto the primary substrate prior to positioning the active layer in contact with the primary substrate.

11. The method according to claim 10, further comprising firing to produce a concave protuberance having a center point in the active layer, wherein the paste layer printed onto the primary substrate is positioned in contact with the active layer applied onto the auxiliary substrate so that the recess defined in the primary substrate is located in approximate alignment with the center point of the concave protuberance.

12. The method according to claim 11, wherein the paste layer has a state, prior to positioning the paste layer in contact with the active layer, which is selected from the group consisting of wet, dried and fired.

13. A method for producing a thick-film structure having a self-supporting region on a primary substrate above a recess defined in the primary substrate, the method comprising:

printing an intermediate layer onto an auxiliary substrate, the intermediate layer having defined therein a hole which remains open;

applying an active layer onto the intermediate layer;

firing the auxiliary substrate, the intermediate layer, and the active layer to produce a concave protuberance in the active layer in the region of hole defined in the intermediate layer;

positioning the active layer in contact with the primary substrate and above the recess defined in the primary substrate so that the concave protuberance in the active layer is aligned with the recess;

firing the primary substrate to bond the active layer thereto; and separating the active layer bonded to the primary substrate from the auxiliary substrate, and firing the active layer to form a thick-film structure having a self-supporting region from the concave protuberance above the recess defined in the primary substrate, wherein the active layer has a thermal expansion coefficient which is less than that of the primary substrate so that a thick-film structure having a self-supporting region above the recess is formed on the primary substrate.

14. The method according to claim 13, wherein the intermediate layer is comprised of a glass-ceramic, wherein the active layer is comprised of a dielectric material which can be fired, and wherein the substrate comprises a primary substance selected from the group consisting of a ceramic, an insulated high temperature steel, and a glass.

15. The method according to claim 13, wherein the self-supporting region of the thick-film structure is circular and has a diameter, wherein the hole defined in the intermediate layer is circular and has a diameter, and wherein the diameter of the hole defined in the intermediate layer is approximately half the diameter of the self-supporting region of the thick-film structure.

16. The method according to claim 13, further comprising firing the intermediate layer in air at a temperature of approximately 850° C. prior to applying the active layer onto the intermediate layer.

17. The method according to claim 13, further comprising printing a filler layer comprised of a filler substance onto the intermediate layer, prior to applying the active layer onto the intermediate layer, to facilitate subsequent separation of the active layer which is bonded to the primary substrate from the auxiliary substrate.

18. The method according to claim 17, wherein the active layer and the filler layer have respective outer contours, and wherein the outer contour of the filler layer is greater than the outer contour of the active layer.

19. The method according to claim 17, further comprising firing the intermediate layer in air at a temperature of about 850° C. prior to applying the filler layer onto the intermediate layer; and firing the filler layer in nitrogen at a temperature of about 850° C. prior to applying the active layer onto the filler layer.

20. The method according to claim 13, further comprising printing a paste layer containing glass onto the primary substrate prior to positioning the active layer in contact with the primary substrate, the paste layer having a state which is selected from the group consisting of wet, dried and fired.

\* \* \* \* \*